(12) United States Patent
Chen et al.

(10) Patent No.: US 7,045,885 B1
(45) Date of Patent: May 16, 2006

(54) PLACEMENT OF ABSORBING MATERIAL IN A SEMICONDUCTOR DEVICE

(75) Inventors: Chien-Hua Chen, Corvallis, OR (US); David M. Craid, Albany, OR (US); Troy D. Schwinabart, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/008,542

(22) Filed: Dec. 9, 2004

(51) Int. Cl.
*H01L 23/02* (2006.01)
*H01L 23/20* (2006.01)

(52) U.S. Cl. .................. 257/678; 257/682; 257/704; 257/710

(58) Field of Classification Search ............... 257/678, 257/682, 704, 710; 438/58, 310, 402, 471, 438/FOR. 144, FOR. 438
See application file for complete search history.

(56) References Cited

U.S. PATENT DOCUMENTS

| | | | |
|---|---|---|---|
| 3,586,926 A | 6/1971 | Nakamura et al. | |
| 5,446,315 A | 8/1995 | Hazaki et al. | |
| 5,773,879 A * | 6/1998 | Fusayasu et al. | 257/678 |
| 5,892,292 A | 4/1999 | Easter | |
| 6,300,680 B1 | 10/2001 | Horikawa et al. | |
| 6,465,873 B1 | 10/2002 | Gonzalez | |
| 6,534,850 B1 | 3/2003 | Liebeskind | |
| 6,740,145 B1 | 5/2004 | Boroson et al. | |
| 2002/0149096 A1 | 10/2002 | Liebeskind | |
| 2003/0085438 A1 | 5/2003 | Habibi et al. | |
| 2003/0132514 A1 | 7/2003 | Liebeskind | |
| 2004/0014267 A1 | 1/2004 | Strauch | |
| 2004/0061207 A1 * | 4/2004 | Ding | 257/678 |
| 2004/0147056 A1 | 7/2004 | McKinnell et al. | |
| 2004/0183177 A1 | 9/2004 | Curtis et al. | |
| 2005/0253230 A1 * | 11/2005 | Punzalan et al. | 257/678 |

FOREIGN PATENT DOCUMENTS

JP  363184342 A  7/1988

OTHER PUBLICATIONS

SAES Getters Website—High Porosity Thin Film Getters—HPTF—http://www.saesgetters.com/default.aspx?idPage=488.

Chip-Level Vacuum Packaging of Micromachines Using NanoGetters; by D. Sparks, S. Massoud-Ansari, N. Najafi, IEEE Transactions on Advanced Packaging, vol. 26, #3, Aug. 2003.

In-line Chemical Concentration Sensor; by D. Sparks, R. Schneider, R. Smith et al., Sensor Expo & Conference, Chicago, IL, Spring 2003.

* cited by examiner

*Primary Examiner*—Jasmine Clark

(57) ABSTRACT

A semiconductor device includes a hermetically sealed housing having a top member and a bottom member. The bottom member includes a recess. A semiconductor die is enclosed within the housing. Absorbing material is positioned in the recess under the semiconductor die. A porous film is positioned between the semiconductor die and the absorbing material.

13 Claims, 6 Drawing Sheets

PLACEMENT OF ABSORBING MATERIAL IN A SEMICONDUCTOR DEVICE

BACKGROUND

Semiconductor devices are widely used today in many electronic applications, such as televisions, children's toys, and computers. Manufacturers of semiconductor devices are working with new materials, new processes, and new technologies daily to develop new semiconductor devices that are a fraction of the size of their ancestors. The smaller the size of the semiconductor device, the smaller the electronic application can be designed. The smaller the size of the electronic application, the more likely consumers are to use the electronics in every day life. This is very evident from the evolution of the computer from the large, slow information processing computers of the 1980's to the fast handheld devices of today.

A typical semiconductor device is manufactured from a number of components including a semiconductor die or "chip" that has been fabricated according to traditional film deposition, masking, etching, and doping processes, a hermetically sealed housing, an absorbing material, such as a getter and/or desiccant material, and strands of wire to connect the die to pins on the housing. Typically, the die is placed in one half of the housing and the strands of wire are connected from the die to the pins on the housing that will provided a means for communicating between the die and the electronic application. Once the die has been seated in the housing, and the strands of wire properly connected, the top half of the housing may be secured to the bottom half of the housing to seal the die within the housing and protect the die from outside contaminants and moisture. While hermetically sealing the die prevents new contaminants from reaching the die, the sealing process does not rid the housing of contaminants that may already be trapped in the housing or contaminants that may be caused by a welding process used to seal the two halves of the housing.

Typically, absorbing material has been added to the device package as a means of absorbing and holding the contaminants and/or moisture present in the housing after the housing has been hermetically sealed. The absorbing material is generally located on the lid of the housing. While the positioning of the absorbing material on the lid of the housing has adequately absorbed contaminants in past devices, new electronic applications are requiring smaller semiconductor devices with the ability to process more information at increasing speeds than the past devices. Further, many semiconductor devices function optically and require a glass window in the top half of the housing to access the die optically. The requirements for smaller device designs require that the glass top half of the housing be recessed to accommodate the desiccant material. This has the effect of either reducing the functional optical die area or increasing the overall package size to regain functionality.

The embodiments described hereinafter were developed in light of this situation and the drawbacks associated with existing systems.

BRIEF DESCRIPTION OF THE DRAWINGS

The present embodiments will now be described, by way of example, with reference to the accompanying drawings, in which.

DETAILED DESCRIPTION

A semiconductor device having absorbing material, such as a getter and/or desiccant material, positioned under a semiconductor die is provided to aid in the design and manufacturing of smaller semiconductor devices. A semiconductor device includes a semiconductor die manufactured by film deposition, masking, etching, and doping processes that are known in the art, a hermetically sealed housing, and absorbing material. The semiconductor device is assembled according to traditional processes of bonding the die to a lower portion of the housing, electrically connecting the die to the housing, and hermetically sealing the die to prevent contaminants from penetrating the housing and damaging the functional characteristics of the die. The absorbing material is positioned under the die to allow for a reduction in the size of the device while allowing for sufficient absorbing material capacity to maintain the internal operating environment of the device as well as ensuring that the absorbing material will not interfere with the operation of the device.

Figure 1:
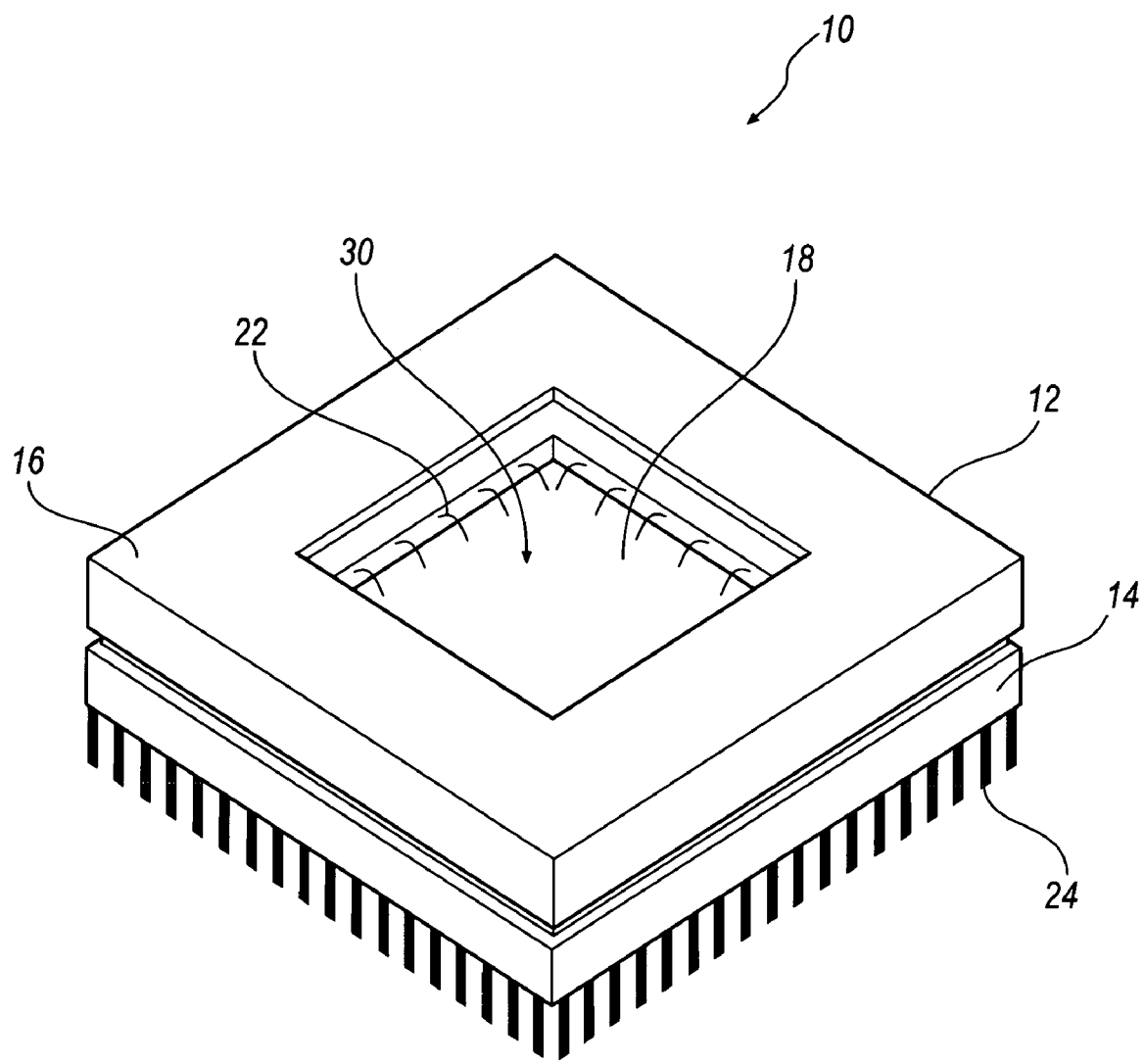
FIG. 1 is a perspective view of a semiconductor device according to an exemplary embodiment.
Figure 2A:
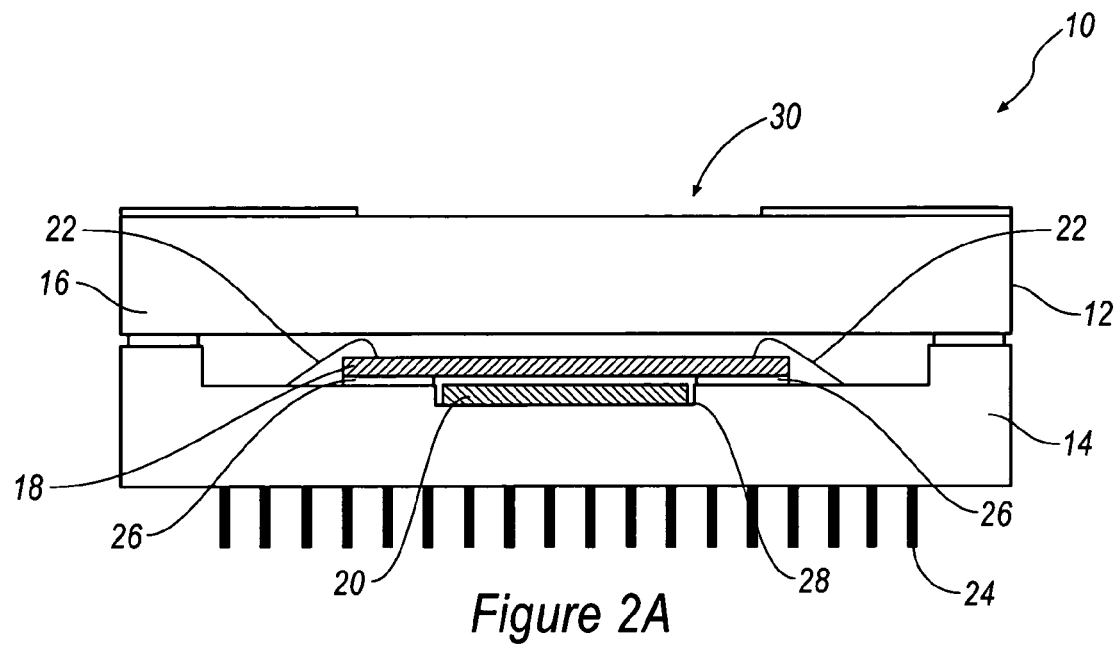
FIG. 2A is a cross-sectional view of the semiconductor device shown in FIG. 1 with absorbing material bonded to a bottom member of the semiconductor device.
Figure 2B:
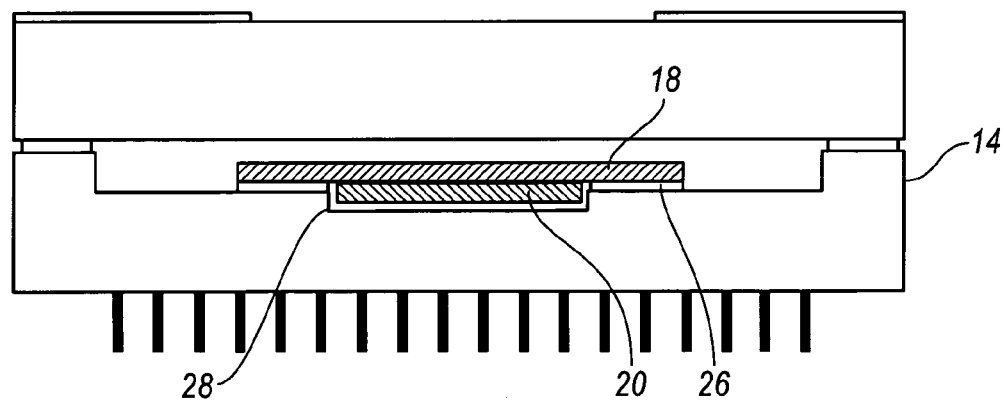
FIG. 2B is a cross-sectional view of the semiconductor device shown in FIG. 1 with the absorbing material bonded to a semiconductor die.

In an exemplary embodiment, FIGS. 1, 2A, and 2B illustrate a semiconductor device 10 that is comprised of a housing 12, such as a ceramic pin grid array (CPGA) housing, having a bottom member 14 and a top member 16, a semiconductor die 18, and absorbing material 20, such as a getter and/or desiccant material. As illustrated by FIGS. 2A and 2B, die 18 is typically bonded with bonding material pads 26, such as solder or epoxy, to bottom member 14 and electrically connected to housing 12 by wire strands 22. Wire strands 22 are further connected to pins 24 on housing 12 so that die 18 may communicate with any electronic application.

Die 18 is manufactured by methods known in the art that generally involve transforming a silicon wafer by a number of film deposition, masking, etching, and doping steps into an operational die such as a microprocessor chip or microelectromechanical (MEMS) chip. Typically, the processes required to manufacture semiconductor die 18 must be completed in an extremely clean environment. The clean environment is required to prevent impurities from penetrating die 18 and damaging the functional characteristics of die 18. Once the die manufacturing process has been completed, die 18 is often in a fragile state. A hermetically sealed housing 12 is used to protect die 18 from any impurities that could be introduced in any electronic application. The hermetic seal may be created by solder reflow, seam welding, or laser welding, for example. Once sealed, housing 12 cannot be opened again to rid the interior of vapor and other contaminants, which may have been introduced before or during the sealing process. Therefore, absorbing material 20 is activated and sealed in housing 12 with die 18 to "soak-up" or absorb the water vapor and any other potentially harmful contaminants that may damage die 18. Absorbing material 20 not only initially absorbs the vapor and contaminants; it also holds the vapor and contaminants for the life of device 10.

Referring now to FIG. 2A, an exemplary semiconductor device 10 is illustrated that includes absorbing material 20 positioned in a recess 28 of bottom member 14 according to an embodiment. Absorbing material 20 may be bonded to bottom member 14 to secure absorbing material 20 in housing 12. The positioning of absorbing material 20 in this manner allows for a variety of semiconductor device design options, such as reducing the size of device 10 and/or the addition of functional features to device 10. Also, particular exemplary devices 10 may have a top member 16 that includes a window or aperture 30 to allow semiconductor device 10 to be employed in applications requiring the optical operation of die 18. One example of employing device 10 optically is in the projection of images in display, digital projector, or other imaging systems. Positioning absorbing material 20 underneath die 18 removes absorbing material 20 from top member 16, thereby allowing the size of top member 16 to be reduced while maintaining an optical path through window 30. Thus, in both instances, the overall size of device 10 may be reduced without having to decrease the size of die 18 and risk the loss of functionality or having to decrease the size of the absorbing material and sacrifice the internal environment of housing 12.

Absorbing material 20 may also be bonded to the underside of semiconductor die 18 prior to the die being bonded to bottom member 14 as illustrated in FIG. 2B. The bonding of absorbing material 20 will not interfere with the functional operation of die 18. The process of bonding absorbing material 20 to die 18 offers manufacturers another possible means of securing absorbing material 20 in semiconductor device 10 while at the same time allowing for a decrease in the package size of device 10 and maintaining the internal environment of housing 12.

Figure 3:
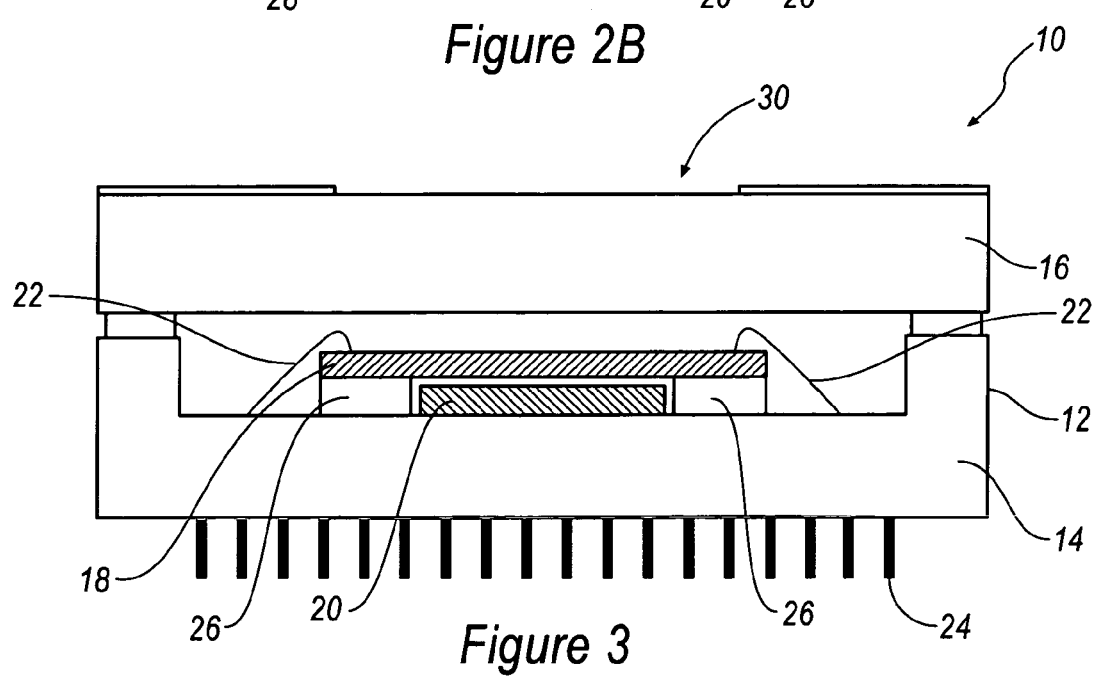
FIG. 3 is a cross-sectional view of a semiconductor device according to another exemplary embodiment.

FIG. 3 illustrates another exemplary embodiment. In this particular embodiment, absorbing material 20 is positioned underneath die 18, between die bonding material pads 26, and bonded to bottom member 14. However, bottom member 14 does not include a recess to seat absorbing material 20, therefore, the overall thickness of housing 12 may not be decreased as it was in FIGS. 2A and 2B where recess 28 was employed. Housing 12 may require the added thickness of bottom member 14 because of the environment that device 18 may be employed. Device 18 may be employed in environments that realize temperature extremes and the thickness of housing 12 may be required to protect die 18. The positioning of absorbing material 20 under die 18 still allows for the use of device 10 in applications requiring optical operation while maintaining the volume and/or surface area of absorbing material to ensure the internal environment of housing 12. Also, absorbing material 20 may also be bonded to die 18 as discussed previously (see e.g. FIG. 2B) to provide further manufacturing options.

Figure 4:
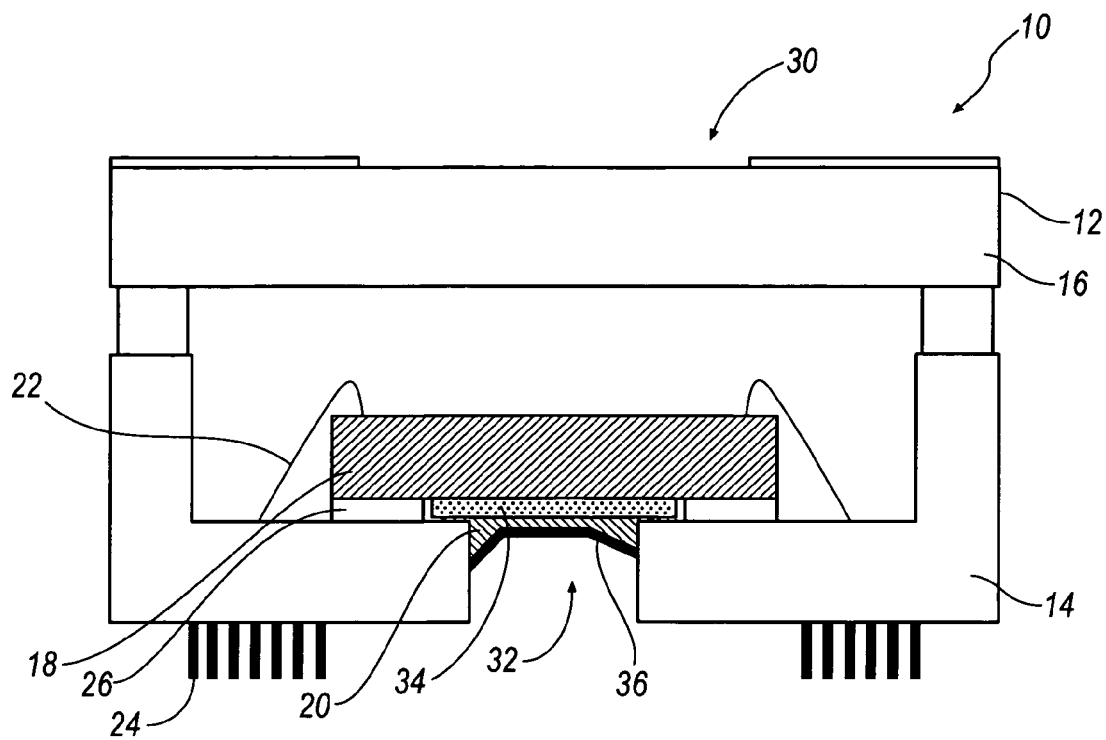
FIG. 4 is a cross-sectional view of a semiconductor device according to another exemplary embodiment.

In the exemplary embodiment illustrated in FIG. 4, absorbing material 20 may be introduced into device 10 by depositing the absorbing material into an aperture 32 of bottom member 14. This particular embodiment increases the manufacturing flexibility even further for a particular semiconductor device by allowing die 18 to be positioned and sealed within housing 12 prior to the introduction of absorbing material 20. Absorbing material 20 is positioned underneath die 18 as described in the previous embodiments to allow for the reduction in size of device 10 as well as the optical operation of device 10. In this particular embodiment, a porous material 34, such as porous silicon or ceramic film, is positioned between die 18 and absorbing material 20. Porous material 34 may be employed to allow absorbing material to communicate with the internal environment in applications where absorbing material 20 may not contact die 18. Contaminants trapped within housing 12 are allowed to pass through porous material 34 to be absorbed by absorbing material 20 in the manner described above. Alternatively, porous material 34 may be omitted and absorbing material 20 may be positioned in direct contact with die 18 (similar to FIG. 2B) so that contaminants pass directly to the absorbing material. A cap 36 may be used to seal absorbing material 20 within housing 12 and hermetically seal device 10. Cap 36 may be formed by depositing a metal film, such as for example aluminum, titanium, or tungsten, into aperture 32.

Figure 5:
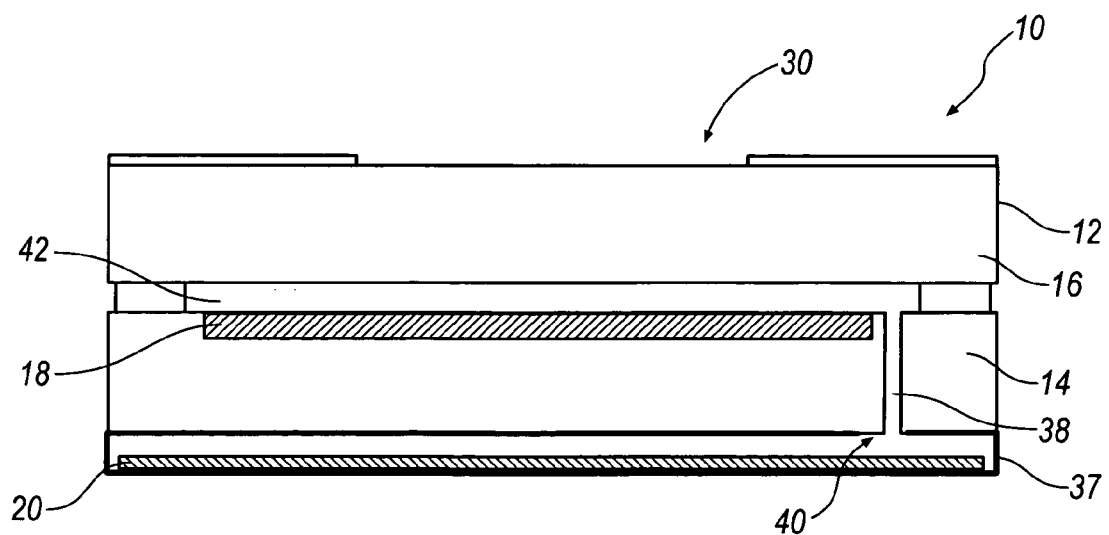
FIG. 5 is a cross-sectional view of a semiconductor device according to another exemplary embodiment.

FIG. 5 illustrates another exemplary embodiment. In this particular embodiment, absorbing material 20 is positioned in a casing 37 that is bonded and sealed on the outside of housing 12 to bottom member 14. Casing 37 may be manufactured from any metal such a kovar, steel, or aluminum. Bottom member 14 includes a port 38 that passes from an outside of bottom member 14 to the interior of device 10. A hole 40 included in casing 37 is aligned with port 38. Contaminants trapped in device 10 during manufacturing may exit a chamber 42 where die 18 is positioned through port 38. Upon leaving chamber 42, contaminants enter casing 37 and are absorbed by absorbing material 20 in the manner described above.

Placing absorbing material 20 into its own casing 37 also offers many advantages. In this particular embodiment, die 18 may be bonded into a recess of bottom member 14 as illustrated in FIG. 5. The placement of absorbing material 20 within its own casing 37 allows the overall surface area of the absorbing material to be increased providing for a greater area of contact and absorption of contaminants. Increasing the surface area of absorbing material 20 allows for higher pumping speed and capacity, which enables a higher vacuum and additional environmental control. This added control allows for a decrease in the overall thickness of absorbing material 20, thereby contributing to minimizing the thickness of device 10. This particular embodiment allows for a larger die size to be employed without increasing the overall size of device 10, thereby increasing or at least maintaining the functionality of die 10 and increasing the number of possible uses of device 18 in electronic applications.

Figure 6:
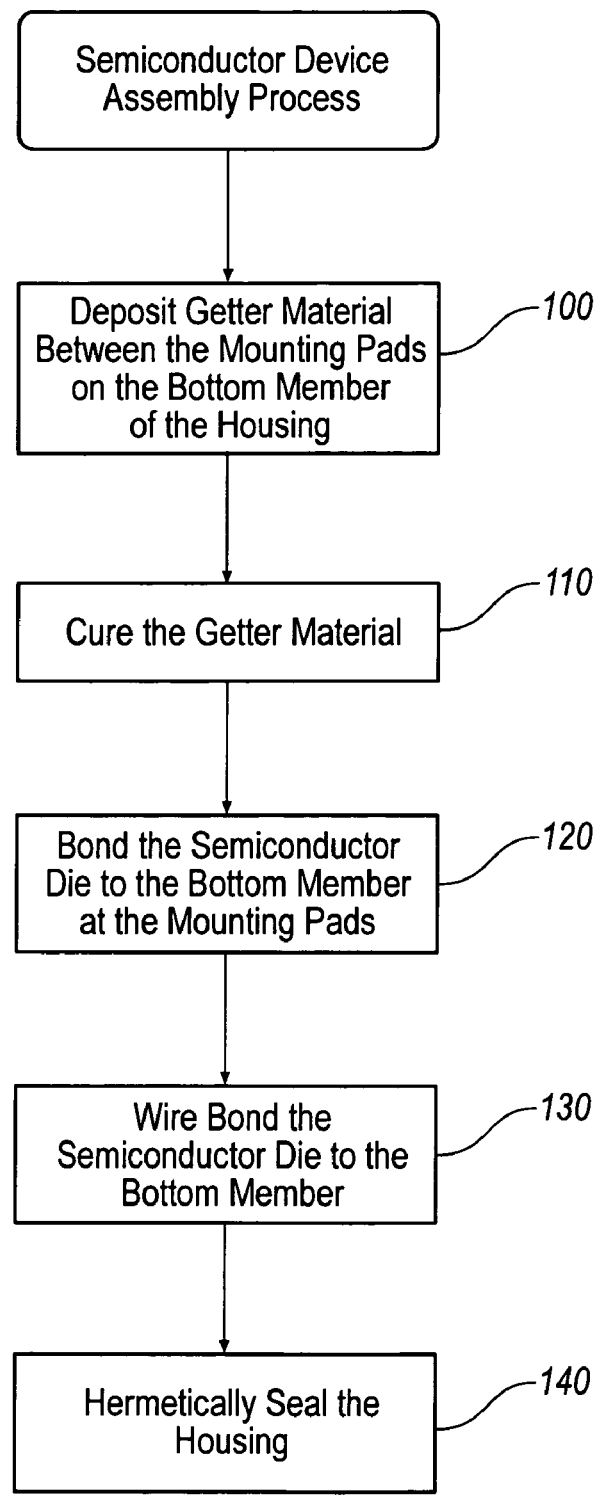
FIG. 6 is a flow diagram of an assembly process for a semiconductor device according to the embodiments illustrated in FIGS. 1–3.

All the above exemplary embodiments may be manufactured in similar ways. The semiconductor die 18 may be manufactured according to the typical die manufacturing processes of depositing a number of films onto a silicon wafer, and processing the wafer through a number of masking and etching processes, and doping the wafer to achieve die 18. FIG. 6 illustrates an exemplary semiconductor device assembly process. Prior to bonding die 18 to bottom member 14, absorbing material 20 is introduced into housing 12 as described FIGS. 2A, 2B, and 3 at step 100. Absorbing material 20 may be deposited into recess 28 of bottom member 14 (see FIG. 2A), onto the backside of die 18 (see FIG. 2B) or onto a surface of bottom member 14 (see FIG. 3). Next, absorbing material 20 is taken through a curing process at step 110. In these particular embodiments, absorbing material is subjected to a temperature of about 320 degrees Celsius for 30 minutes. Die 18 is then positioned over absorbing material 20 and bonded or soldered to bottom member 14 of housing 12 at step 120. Wire strands 22 are attached between die 18 and bottom member 14 at step 130 and top member 16 is positioned on bottom member 14 and housing 12 is hermetically sealed at step 140 to prevent further contaminants from entering device 10 and damaging the functional characteristics of die 18.

Figure 7:
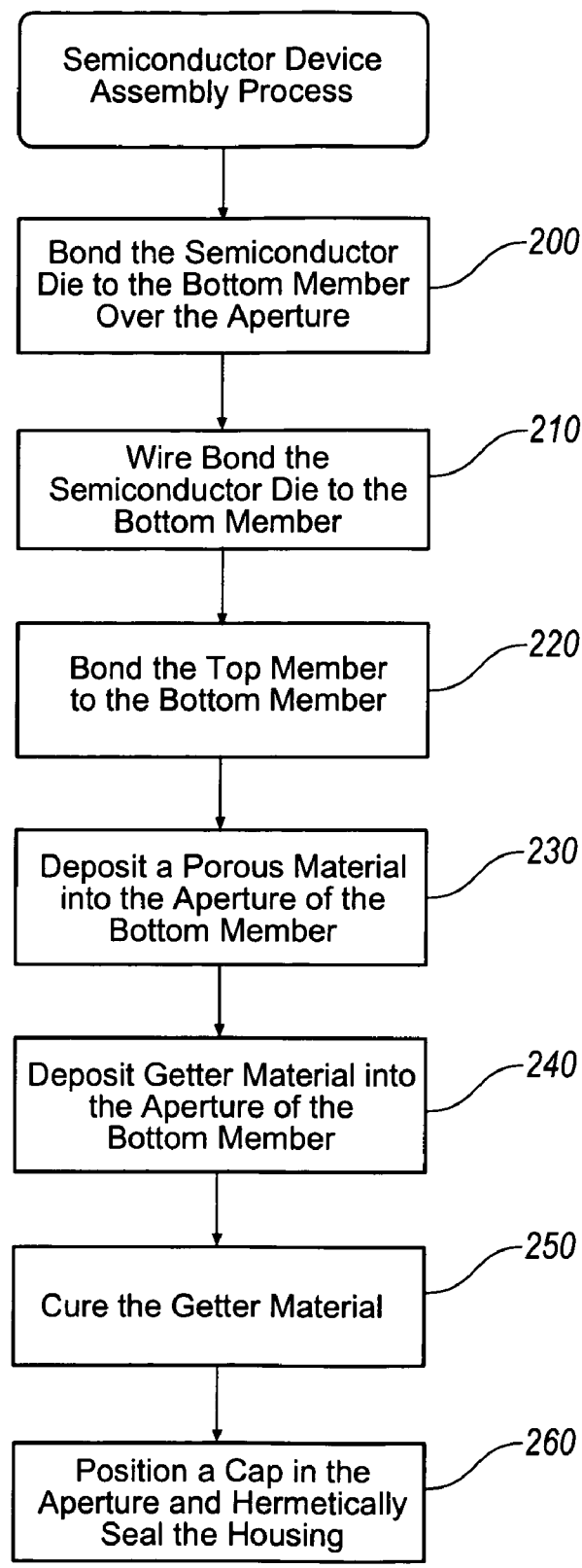
FIG. 7 is a flow diagram of an assembly process for a semiconductor device according to the embodiment illustrated in FIG. 4.

FIG. 7 illustrates the assembly process of device 10 shown in FIG. 4 and involves a similar process to that of FIGS. 2A, 2B and 3 except that die 18 is sealed between bottom member 14 and top member 16 prior to depositing absorbing material 20. Die 18 is positioned over aperture 32 and bonded to bottom member 14 at step 200. Die 18 is wire bonded to bottom member 14 at step 210. Top member 16 and bottom member 14 are bonded together at step 220. Porous material 34 is deposited into aperture 32 at step 230. Absorbing material 20 is introduced into device 10 through aperture 32 at step 240 and cured at step 250. Aperture 32 is hermetically sealed with cap 36 at step 260 to prevent further contaminants from entering device 10 and damaging the functional characteristics of die 18.

Figure 8:
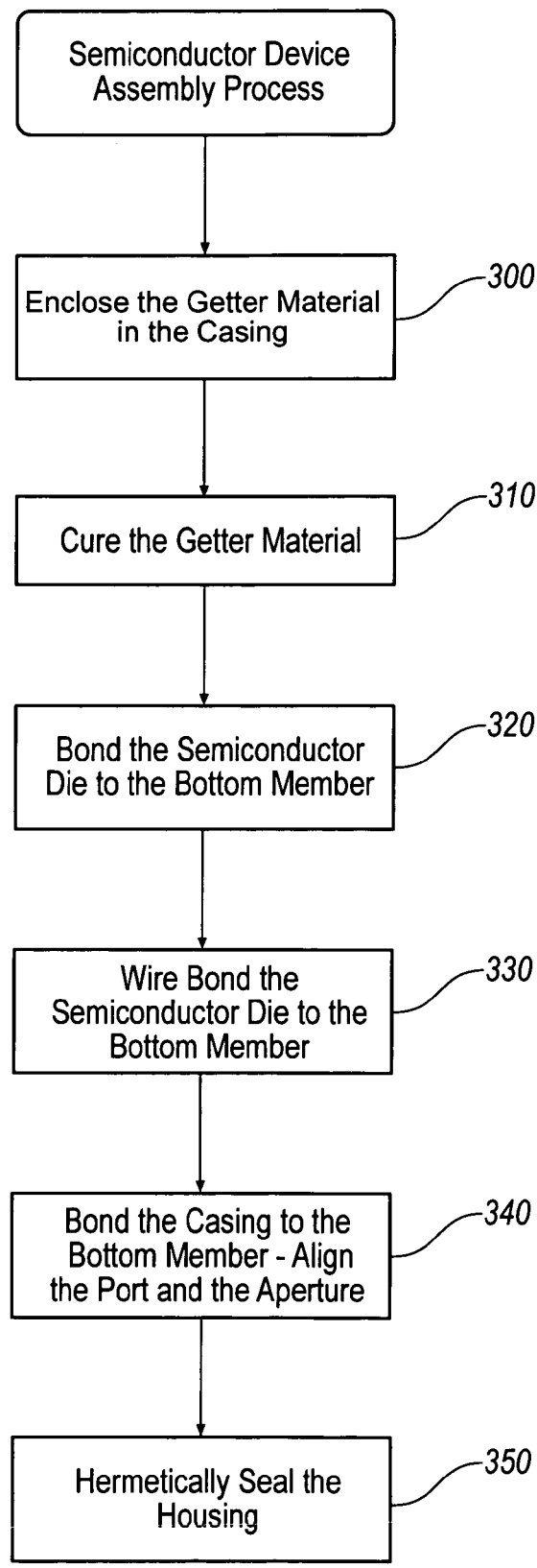
FIG. 8 is a flow diagram of an assembly process for a semiconductor device according to the embodiment illustrated in FIG. 5.

FIG. 8 illustrates the assembly process of device 10 shown in FIG. 5 and provides for the embedding of die 18 into bottom member 14. Absorbing material 20 is deposited into its own casing 37 at step 300 and cured at step 310. Semiconductor die 18 is bonded to bottom member 14 at step 320 and die 18 is then wire bonded to bottom layer 14 at step 330. Next, Casing 37 is bonded to bottom member 14 so that hole 40 in casing 37 is aligned with port 38 in bottom member 14 at step 340 so that contaminants in chamber 42 may pass to absorbing material 20. Housing 12 is then hermetically sealed between top member 16 and bottom member 14 at step 350 to prevent any contaminants from entering housing 12 and damaging device 10.

The above-described system and methods provide significant advantages over known systems and methods. Specifically, the positioning of the absorbing material underneath the semiconductor die allows for the size of the semiconductor device package to be decreased without sacrificing functionality, thereby increasing the uses of the semiconductor devices in a wider variety of electronic applications. Also, the size of the absorbing material may be maintained so that the internal environment of the housing is not sacrificed, which, in turn ensures the functional integrity of the die.

While the present invention has been particularly shown and described with reference to the foregoing preferred embodiment, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiment is illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A semiconductor device comprising:
    a hermetically sealed housing having a top member and a bottom member, said bottom member including a recess;
    a semiconductor die enclosed within said housing;
    absorbing material positioned in said recess under said semiconductor die; and
    a porous film positioned between said semiconductor die and said absorbing material.

2. The semiconductor device as recited in claim 1, wherein said absorbing material is attached to said housing within said recess.

3. The semiconductor device as recited in claim 1, wherein said absorbing material is attached to a bottom surface of said semiconductor die and positioned in said recess when said die is secured in said housing.

4. The semiconductor device as recited in claim 1, further including a cap positioned in said recess over said absorbing material.

5. A semiconductor device comprising:
    a hermetically sealed housing having a top member and a bottom member, said bottom member including a recess;
    a semiconductor die enclosed within said housing; means to absorb contaminants and vapor that have been sealed in said housing, said means to absorb positioned in said recess under said semiconductor die; and
    a porous film positioned between said semiconductor die and said absorbing means.

6. The semiconductor device as recited in claim 5, wherein said absorbing means is attached to said housing within said recess.

7. The semiconductor device as recited in claim 5, wherein said absorbing means is attached to a bottom surface of said semiconductor die and positioned in said recess when said die is secured in said housing.

8. The semiconductor device as recited in claim 5, further including a cap positioned at said recess over said absorbing means.

9. A semiconductor device comprising:
    a hermetically sealed housing having a top member and a bottom member, said bottom member including a port;
    a semiconductor die enclosed within said housing;
    a casing bonded to said bottom member, said casing having an aperture positioned at said port;
    absorbing material enclosed in said casing and positioned under said semiconductor die; and
    a porous film positioned between said semiconductor die and said absorbing material.

10. The semiconductor device as recited in claim 9, wherein said casing material is kovar.

11. A semiconductor device comprising:
    a hermetically sealed housing having a top member and a bottom member;
    a plurality of mounting pads disposed on a surface of said bottom member;
    a semiconductor die enclosed within said housing and bonded to said plurality of mounting pads;
    absorbing material positioned within a space defined by said mounting pads, said semiconductor die, and said bottom member surface; and a porous film positioned between said semiconductor die and said absorbing material.

12. The semiconductor device as recited in claim 11, wherein said absorbing material is attached to said bottom member surface.

13. The semiconductor device as recited in claim 11, wherein said absorbing material is attached to a bottom of said semiconductor die.

* * * * *